United States Patent
Gailhard et al.

(10) Patent No.: US 11,115,038 B2
(45) Date of Patent: Sep. 7, 2021

(54) METHOD FOR MANAGING THE STARTUP OF A PHASE-LOCKED LOOP AND CORRESPONDING INTEGRATED CIRCUIT

(71) Applicant: STMicroelectronics (Rousset) SAS, Rousset (FR)

(72) Inventors: Bruno Gailhard, Rognes (FR); Laurent Truphemus, Pourrieres (FR); Christophe Eva, Rousset (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 16/923,335

(22) Filed: Jul. 8, 2020

(65) Prior Publication Data
US 2021/0013893 A1   Jan. 14, 2021

(30) Foreign Application Priority Data
Jul. 9, 2019   (FR) ...................................... 1907661

(51) Int. Cl.
| | |
|---|---|
| *H03L 7/10* | (2006.01) |
| *H03L 7/089* | (2006.01) |
| *H03L 7/099* | (2006.01) |

(52) U.S. Cl.
CPC .............. *H03L 7/10* (2013.01); *H03L 7/0891* (2013.01); *H03L 7/099* (2013.01)

(58) Field of Classification Search
CPC ....................................................... H03L 7/199
See application file for complete search history.

(56) References Cited

U.S. PATENT DOCUMENTS

| | | | |
|---|---|---|---|
| 5,898,328 A | 4/1999 | Shoji | |
| 5,963,068 A * | 10/1999 | Hardesty | ................. H03L 7/095 327/156 |
| 8,723,567 B1 * | 5/2014 | Dang | ................. H03H 11/1269 327/157 |
| 10,763,871 B1 * | 9/2020 | Patasani | ............... H03C 3/0941 |
| 10,833,684 B1 * | 11/2020 | Bhagwan | ............... H03L 7/093 |
| 2002/0153959 A1 | 10/2002 | Gotz et al. | |
| 2006/0267640 A1 * | 11/2006 | Travis | ....................... H03L 7/10 327/105 |
| 2008/0036513 A1 | 2/2008 | Koyama et al. | |
| 2012/0161835 A1 * | 6/2012 | David | ..................... H03L 7/146 327/157 |

(Continued)

FOREIGN PATENT DOCUMENTS

EP        1170869 A2     1/2002

OTHER PUBLICATIONS

INPI Search Report and Written Opinion for FR 1907661 dated Apr. 9, 2020 (10 pages).

*Primary Examiner* — Adam D Houston
(74) *Attorney, Agent, or Firm* — Crowe & Dunlevy

(57) ABSTRACT

The operation of the phase-locked loop includes a startup phase where a reference signal having a duty cycle of 50% is applied to a phase comparator of the loop. A first divider of an output signal of the voltage-controlled oscillator of the loop is reset at each first type signal edge of the reference signal. The phase comparator receives the reference signal and a feedback signal from the first divider and generates a control pulse at each second type signal edge of the reference signal that causes a control voltage of the oscillator to increase.

48 Claims, 3 Drawing Sheets

(56) References Cited

U.S. PATENT DOCUMENTS

| | | | |
|---|---|---|---|
| 2014/0176205 A1* | 6/2014 | Nakura | H03L 7/099 |
| | | | 327/156 |
| 2017/0187384 A1* | 6/2017 | Shimada | H03L 1/027 |
| 2017/0328712 A1* | 11/2017 | Collin | H03D 7/00 |
| 2018/0076619 A1* | 3/2018 | Gupta | H02J 1/02 |
| 2018/0115164 A1* | 4/2018 | Gupta | H02M 1/36 |
| 2018/0145696 A1* | 5/2018 | Sarda | H03L 7/0816 |
| 2018/0302097 A1* | 10/2018 | Guo | H03L 7/1976 |
| 2019/0013815 A1* | 1/2019 | Saric | H03L 7/095 |
| 2019/0020310 A1* | 1/2019 | Modi | H04L 27/2647 |
| 2019/0394849 A1* | 12/2019 | Wang | H05B 45/3575 |
| 2020/0350919 A1* | 11/2020 | Marcu | H03L 7/099 |
| 2021/0013893 A1* | 1/2021 | Gailhard | H03L 7/099 |
| 2021/0067164 A1* | 3/2021 | Dal Toso | H03L 7/199 |

* cited by examiner

METHOD FOR MANAGING THE STARTUP OF A PHASE-LOCKED LOOP AND CORRESPONDING INTEGRATED CIRCUIT

PRIORITY CLAIM

This application claims the priority benefit of French Application for Patent No. 1907661, filed on Jul. 9, 2019, the content of which is hereby incorporated by reference in its entirety to the maximum extent allowable by law.

TECHNICAL FIELD

Modes of implementation and embodiments relate to integrated circuits and, in particular, to phase-locked loops as they are commonly known to those skilled in the art and, more particularly, to managing the startup of a phase-locked loop.

BACKGROUND

Phase-locked loops are generally used in digital systems, for example a programmable core or a microprocessor, requiring a high internal operating frequency, for example of the order of several hundred megahertz.

The role of phase-locked loops is therefore, in particular, to deliver an internal clock signal having a high operating frequency to these digital systems.

However, due to the presence of the feedback loop and the capacitive network that are necessary in order to stabilize the phase-locked loop, the startup time, that is to say the duration time necessary in order for the loop to stabilize (i.e., where the reference signal and the output signal of the oscillator are close to mutual synchronization) may be very lengthy, typically greater than 100 µs.

Moreover, during this startup phase, there is a frequency overshoot on the output signal of the oscillator of the loop with respect to its final nominal value. This frequency overshoot may also reach as much as 25% of the final nominal value.

Such a frequency overshoot at startup means that the digital circuit of the PLL must be designed to withstand such a higher frequency. The speed of this circuit therefore has to be increased, thereby in particular causing an increase in leakage currents and/or in dynamic consumption.

There is therefore a need to limit the startup time of a phase-locked loop and the amplitude of this frequency overshoot.

SUMMARY

According to one aspect, what is proposed is a method for managing the operation of a phase-locked loop.

The operation of the phase-locked loop comprises a startup phase or step involving: delivering a reference signal having a duty cycle of 50% to a phase comparator of the loop, resetting a first divider of the output signal of the voltage-controlled oscillator of the loop at each signal edge of a first type, for example at each rising signal edge, of the reference signal, and delivering, via the phase comparator receiving the reference signal and a feedback signal from the first divider, a control pulse during which the control voltage of the oscillator increases, at each signal edge of a second type, for example at each falling signal edge, of the reference signal.

Combining these features, and in particular providing a reference signal having a duty cycle of 50%, and resetting the divider of the loop at each rising signal edge (for example) of the reference signal allows a significant reduction in the startup time of the loop and of the frequency overshoot.

Thus, by way of indication, for a frequency of the reference signal equal to 2, 4, 8 or 16 MHz and a nominal frequency of the output signal of the oscillator equal to 832 MHz, a startup time of the order of around thirty microseconds is achieved, in contrast to a startup time of 70 to more than 100 microseconds for a conventional locked loop.

Likewise, a frequency overshoot on the output signal of the oscillator of the order of a few percent, for example of the order of 2%, is achieved, in contrast to up to 25% for a conventional phase-locked loop.

In the event of the presence of an initial reference signal not having a duty cycle of 50%, then the delivery of the reference signal advantageously comprises dividing this initial reference signal by two so as to obtain the reference signal having the duty cycle of 50% and, in this case, the feedback signal is not the output signal directly from the first divider of the loop, but the output signal of the first divider divided by two.

This makes it possible to use any initial reference signal, regardless of its duty cycle.

Although it would be possible for the control pulse delivered by the phase comparator to be used in a charge pump circuit, it is particularly advantageous, during the startup phase, to "short-circuit" this charge pump circuit, to directly apply a pre-charging current to a resistive capacitive filter connected to the input of the oscillator.

In other words, according to such a mode of implementation, during the startup phase, increasing the control voltage of the oscillator comprises applying a pre-charging current to a resistive capacitive filter connected to the input of the oscillator.

This further contributes to reducing the startup time of the loop and making this startup time less dependent on the current constraints of the charge pump, which constraints are linked to the stability of the loop.

According to one mode of implementation, the resistive capacitive filter comprises: a first branch connected between said input of the oscillator and ground and containing a resistive network connected in series with a first capacitor having a first capacitance, said resistive network containing a first resistor connected between said input of the oscillator and an intermediate node and having a first resistance, and a second resistor connected between the intermediate node and the first capacitor and having a second resistance, and a second branch connected between said input of the oscillator and ground and containing a second capacitor having a second capacitance.

The first capacitance is then advantageously equal to A times the second capacitance, whereas the first resistance is equal to A times the second resistance.

The pre-charging current is then advantageously applied to said intermediate node.

A homogeneous increase of the two capacitive voltages across the terminals of the two capacitors, and therefore a stable increase of the capacitive voltage delivered at the input of the oscillator, is achieved.

According to one mode of implementation, the startup phase ends when the duration of the control pulse is less than a few percent, for example 2%, of the product of the period of the output signal of the oscillator and the division ratio of the first divider.

According to one mode of implementation, when the startup phase has ended, the output of the phase comparator is connected to a charge pump circuit the output of which is connected to the input of the voltage-controlled oscillator.

In other words, when, during the startup phase, the charge pump circuit has been disconnected and a pre-charging current has been applied to the resistive capacitive filter, the charge pump circuit is this time reconnected to the phase comparator at the end of the startup phase.

Of course, if the charge pump circuit were to have been left connected to the phase comparator during the startup phase, this connection is not modified at the end of the startup phase.

According to one mode of implementation, when, during the startup phase, the initial reference signal and the output signal of the first divider have been divided by two, these divisions by two are not continued when the startup phase has ended.

In other words, when the startup phase has ended, the initial reference signal is delivered to the phase comparator, whereas the feedback signal delivered to the phase comparator is the output signal of the first divider.

Moreover, when the startup phase has ended, it is advantageously possible to perform a last reset of the first divider on the first signal edge of a first type, for example the first rising signal edge, of the reference signal following the end of the startup phase.

This makes it possible to synchronize the reference signal and the feedback signal from the first divider.

According to another aspect, what is proposed is an integrated circuit, comprising a phase-locked loop containing: a phase comparator, a voltage-controlled oscillator, a first divider connected between the output of the oscillator and a first input of the phase comparator, a delivery circuit configured so as to deliver a reference signal having a duty cycle of 50% on a second input of the phase comparator, in a startup phase of the loop, a reset circuit configured so as, in said startup phase, to reset the first divider at each signal edge of a first type of the reference signal, the phase comparator being configured so as, in said startup phase, to deliver a control pulse at each signal edge of a second type of the reference signal, and a control circuit configured so as to increase the control voltage of the oscillator during said control pulse.

According to one embodiment, the delivery circuit comprises: an input for receiving an initial reference signal, a divide-by-two divider connected to said input, and an output configured so as to deliver the initial reference signal divided by two as reference signal, and wherein the integrated circuit further comprises another divide-by-two divider connected between the output of the first divider and the first input of the phase comparator.

According to one embodiment, the control circuit contains a current source able to be activated upon said pulse and configured so as to apply, once activated, a pre-charging current to a resistive capacitive filter connected at the input of the oscillator.

According to one embodiment, the resistive capacitive filter comprises: a first branch connected between said input of the oscillator and ground and containing a resistive network connected in series with a first capacitor having a first capacitance, said resistive network containing a first resistor connected between said input of the oscillator and an intermediate node and having a first resistance, and a second resistor connected between the intermediate node and the first capacitor and having a second resistance, and a second branch connected between said input of the oscillator and ground and containing a second capacitor having a second capacitance, wherein the first capacitance is equal to A times the second capacitance, and the first resistance being equal to A times the second resistance, and wherein the current source is connected to said intermediate node.

According to one embodiment, the integrated circuit further comprises a detection circuit configured so as to detect the end of the startup phase.

According to one embodiment, the detection circuit is configured so as to detect the duration of the control pulse and/or the type of the pulse signal delivered by the phase comparator.

The detection circuit may thus be configured so as to deliver a signal representative of the end of the startup phase when the duration of the control pulse is less than a few percent of the product of the period of the output signal of the oscillator and the division ratio of the first divider.

As a variant, the detection circuit may be configured so as to deliver a signal representative of the end of the startup phase when the first pulse of the pulse signal delivered by the phase comparator, requesting a reduction of the control voltage of the voltage-controlled oscillator, is detected.

According to one embodiment, the integrated circuit is configured so as, when the startup phase has ended, to connect the output of the phase comparator to a charge pump circuit having an output that is connected to the input of the voltage-controlled oscillator.

According to one embodiment, when the startup phase has ended, the delivery circuit is configured so as to deliver the initial reference signal to the phase comparator, and the integrated circuit contains a control circuit configured so as to deactivate said other divide-by-two divider, such that the feedback signal delivered to the phase comparator is the output signal of the first divider.

According to one embodiment, the reset circuit is configured so as, when the startup phase has ended, to perform a last reset of the first divider on the first signal edge of a first type of the reference signal following the end of the startup phase.

BRIEF DESCRIPTION OF THE DRAWINGS

Other advantages and features of the invention will become apparent upon examining the detailed description of the completely non-limiting embodiments and modes of implementation of the invention and the appended drawings, in which.

DETAILED DESCRIPTION

Figure 1:
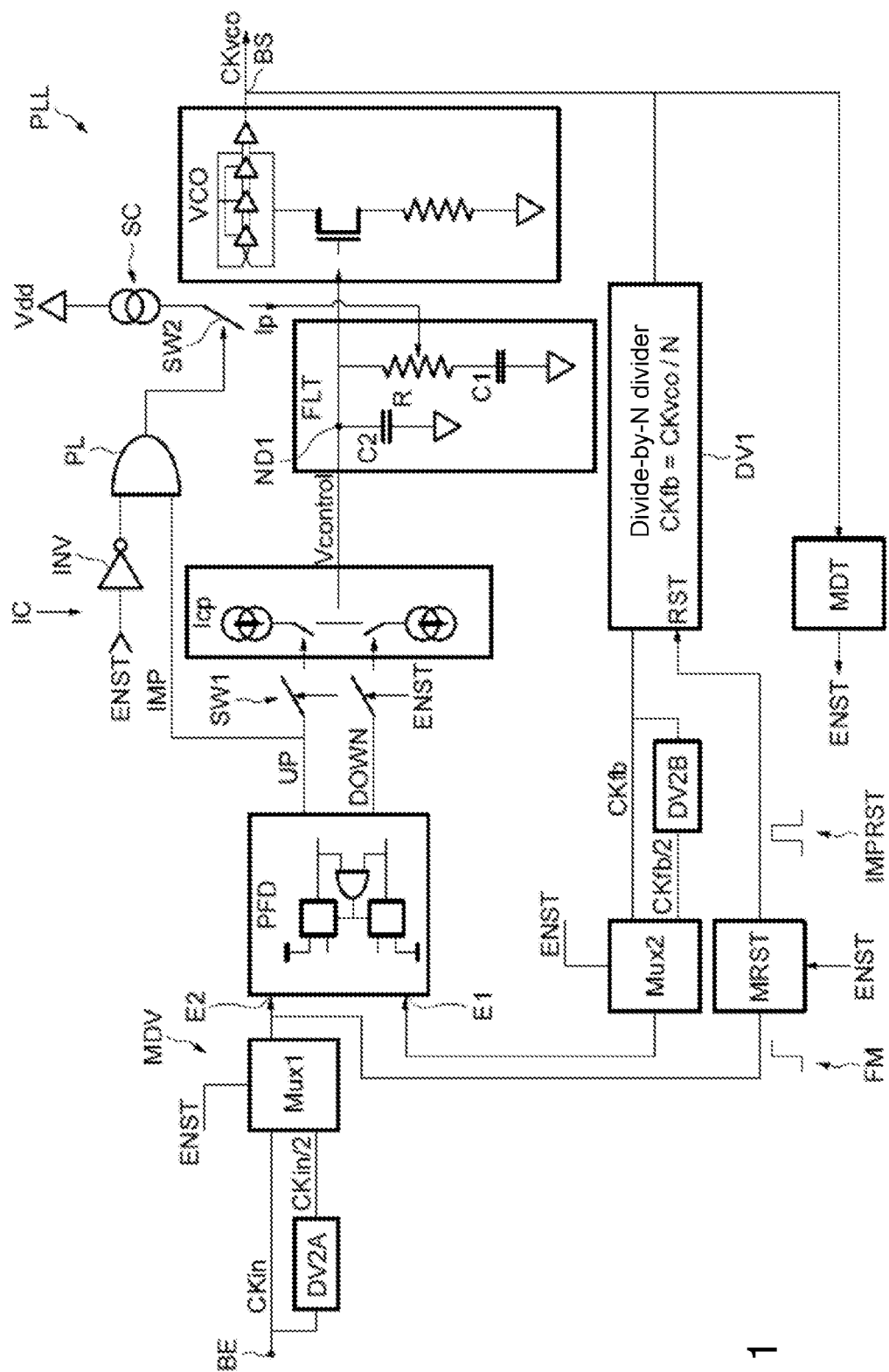
FIG. 1 shows a diagram of a phase-locked loop circuit.

In FIG. 1, the reference PLL denotes a phase-locked loop circuit including an input terminal BE for receiving an initial reference signal CKin and an output terminal BS for delivering the output signal $CK_{VCO}$ generated by a voltage-controlled oscillator VCO.

By way of example, the frequency of the initial reference signal CKin may be equal to 16 MHz, whereas the frequency of the output signal $CK_{VCO}$ may be equal to 832 MHz.

Moreover, the output terminal BS of the phase-locked loop PLL is connected to the input of a first divider DV1, for example a fractional divider, configured to divide the signal $CK_{VCO}$ delivered by the local oscillator VCO by N.

The division ratio N is equal to the ratio between the frequency of the signal $CK_{VCO}$ and the frequency of the initial reference signal CKin.

By way of example, in this case, this division ratio is equal to 800/16, that is to say 52. This divide-by-N divider has a conventional structure that is known per se, and is typically formed by a counter that is able to be reset by virtue of receiving a reset signal or pulse IMPRST on its reset input RST.

The output signal of the first divider is referenced CKfb.

The phase-locked loop PLL involves a startup phase or step at the end of which the reference signal delivered at the input of the phase comparator PFD (having a conventional and known structure) of the loop and the signal CKfb are virtually synchronized. Of course, when the reference signal and the signal CKfb are virtually synchronized, the reference signal and the output signal $CK_{VCO}$ are also virtually synchronized.

The end of this startup phase occurs here, in this example, when a logic signal ENST has for example the logic value "1".

It is now assumed in this example that the initial reference signal CKin has any duty cycle, in particular other than 50%.

For this purpose, the loop PLL comprises a delivery circuit MDV configured to deliver the reference signal CKin/2, which is a division by two of the initial reference signal CKin, on the second input E2 of the phase comparator PFD.

For this purpose, the delivery circuit in this case contains, for example, a divide-by-two divider, DV2A, which is in fact a counter, connected to the input terminal BE and delivering the reference signal CKin/2.

The delivery circuit MDV moreover contains a first multiplexer Mux1, controlled by the signal ENST and receiving, on the one hand, the reference signal CKin/2 and the initial reference signal CKin.

During the startup phase, that is to say when the logic signal ENST has the logic value "0", the multiplexer Mux1 delivers, on the input E2, the initial reference signal divided by two, which thus forms the reference signal received on the second input E2 of the phase comparator PFD.

The feedback signal delivered on the first input E1 of the phase comparator PFD comes from a second multiplexer Mux2 that is also controlled by the signal ENST.

The output signal of the first divider CKfb is delivered to a first input of the second multiplexer Mux2.

The second input of the second multiplexer Mux2 receives the signal CKfb/2 delivered by another divide-by-two divider DV2B and that therefore results from the division by two of the signal CKfb.

Thus, in this example, during the startup phase of the loop PLL, since the input E2 of the phase comparator receives the reference signal CKin/2, the feedback signal delivered on the first input E1 of the phase comparator is the signal CKfb/2.

The phase comparator PFD, as is conventional, depending on the signals present at its two inputs, delivers either a control pulse UP configured to increase the control or command voltage at the input of the oscillator VCO or a control pulse DOWN configured to reduce this control voltage.

The loop PLL moreover contains a resistive capacitive filter FLT having a node ND1 connected to the command or control input of the voltage-controlled oscillator VCO.

The phase-locked loop PLL moreover contains a charge pump circuit CHP, having a structure that is conventional and known per se, configured to receive the two control pulses UP and DOWN, and delivering a current to the resistive capacitive filter FLT, thereby producing the control voltage Vcontrol able to be applied to the input of the oscillator.

That being said, in this embodiment, the phase comparator PFD is connected to the input of the charge pump circuit CHP by a set of first switches SW1 able to be commanded by the logic signal ENST.

In another embodiment, the set of first switches SW1 may be replaced by logic gates one input of which is connected to the logic signal ENST that makes it possible to open the switches internal to the charge pump circuit CHP.

Thus, in this embodiment, when the phase-locked loop is in its startup phase (ENST=0, for example), the switches SW1 are opened, disconnecting the charge pump circuit CHP from the outputs of the phase comparator PFD.

Figure 2:
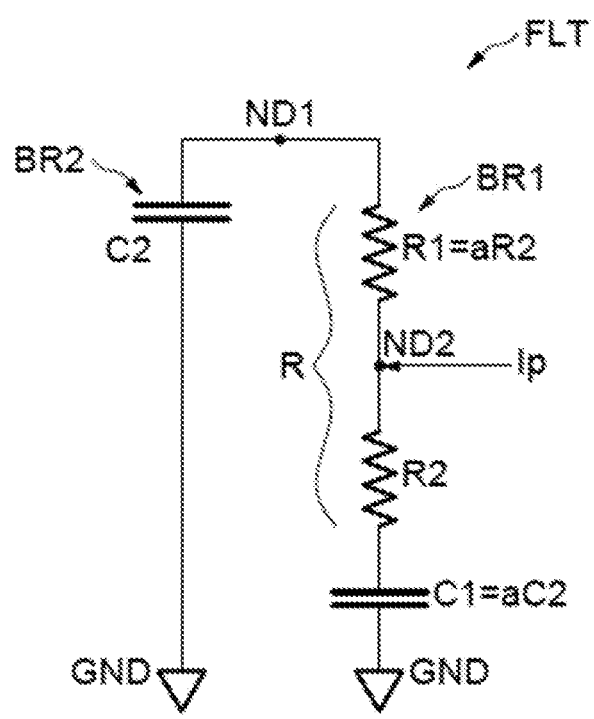
FIG. 2 is a diagram for a filter circuit.

As illustrated in FIG. 2, the filter FLT in this case contains a first branch BR1 connected between the node ND1 and ground GND and a second branch BR2 also connected between the node ND1 and ground GND.

The first branch comprises a resistive network R connected in series with a first capacitor C1.

The resistive network R contains a first resistor R1 connected between the node ND1 and an intermediate node ND2 and a second resistor R2 connected between the intermediate node ND2 and the first capacitor C1.

For the sake of simplification, C1, C2, R1 and R2 will also respectively denote the capacitance of the first capacitor C1, the capacitance of the second capacitor C2, the resistance of the first resistor R1 and the resistance of the second resistor R2.

In this example, the capacitance C1 of the first capacitor C1 is equal to a value of a constant A times the capacitance C2 of the second capacitor C2. By way of indication, the value of A is of the order of 10.

The resistance R1 of the first resistor R1 is for its part equal to a value of A times the resistance R2 of the second resistor R2.

The product R2C1 is hence equal to the product R1C2, that is to say to A times the product R2C2.

Plus, during the startup phase, a pre-charging current Ip will be applied to the intermediate node ND2.

Plus, since C1 is equal to aC2, it will take the same time to pre-charge C1 and C2, this time being equal to the constant of the filter divided by A.

As illustrated in FIG. 1, this pre-charging current Ip comes from a current source SC able to be activated by way of a second switch SW2 commanded by the output of a logic AND gate, referenced PL.

This gate PL receives the control pulse IMP of the signal UP on a first input, and the signal ENST inverted by an inverter INV on a second input.

During the startup phase, the signal ENST is at "0", and it is at "1" after the startup phase.

During the startup phase, the second switch SW2 is thus commanded by the pulses of the signal UP, whereas, after the startup phase, the second switch SW2 is always open.

More precisely, during the startup phase, if the signal UP is at the high level (representative of a pulse IMP), the switch SW2 is closed and the current source delivers the pre-charging current Ip on the intermediate node ND2.

And this lasts for as long as the signal UP is at 1, that is to say for as long as the control pulse IMP is present.

By contrast, as soon as the pulse IMP disappears (signal UP at zero), the switch SW2 is opened and no pre-charging current is delivered to the node ND2.

The capacitive filter FLT therefore charges during the pulses IMP, and these charging operations make it possible to increase the control voltage at the input of the oscillator VCO, thereby consequently making it possible to increase the frequency of the output signal of this oscillator.

The current source SC and the filter FLT therefore form part of control circuit configured so as to increase the control voltage of the oscillator during said control pulse IMP.

The first divider DV1 is reset, as indicated above, by applying a reset pulse IMPRST to the reset input RST of the divider.

This reset pulse IMPRST is obtained, in the startup phase, by reset circuit MRST in response to each rising signal edge FM of the reference signal, which is in this case the signal CKin/2.

Of course, it would have been possible to perform this resetting on each falling signal edge of the signal CKin/2.

Moreover, as will be seen in more detail below, once the startup phase has ended, the reset circuit MRST will deliver a last reset pulse on the first rising signal edge of the reference signal, which will this time be the signal CKin, that follows the end of the startup phase.

The reset circuit MRST may easily be produced by way of logic circuits.

Moreover, the integrated circuit IC incorporating the phase-locked loop PLL also contains detection circuit MDT configured so as to detect the end of the startup phase and therefore deliver the logic value 1 to the signal ENST.

The end of the startup phase is considered to be reached when the duration T of the control pulse IMP corresponding to the high state of the "up" signal is less than a few percent of the product of the nominal period $T_{CKVCO}$ of the output signal of the oscillator VCO and the division ratio N.

By way of example, this threshold may be taken to be equal to 2%.

Therefore, according to a first possibility, in order to detect this startup phase end condition, the detection circuit MDT may be configured so as to count the number of signal edges of the signal $CK_{VCO}$ during the duration of the pulse IMP.

According to another possible embodiment, the detection circuit MDT may contain a low-pass filter receiving the signal UP and the time constant of which is linked to said threshold of a few percent.

Depending on whether or not the output of this filter delivers a high signal, the detection circuit MDT will deliver either the logic value "0" or the logic value "1" of the signal ENST.

Figure 3:
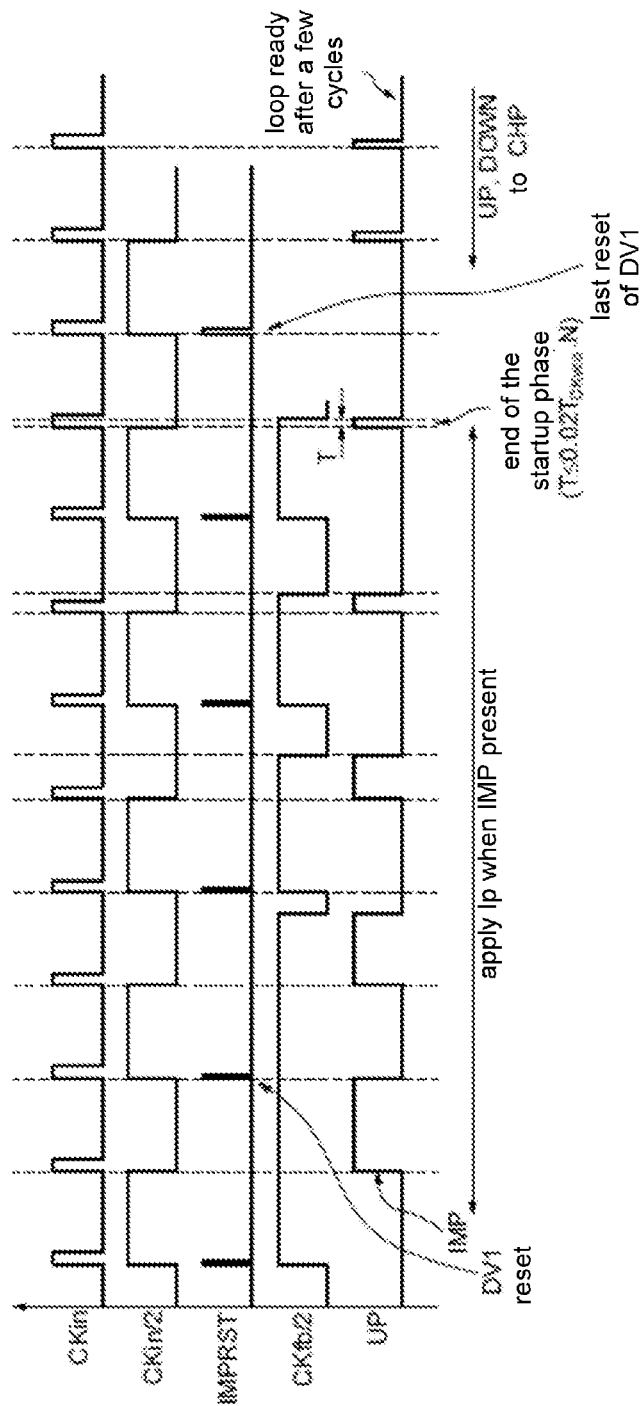
FIG. 3 is a timing diagram illustrating a mode of implementation of the method for managing the operation of the loop PLL.

As a variant, the end of the startup phase may also be considered to be reached when the first control pulse corresponding to the high state of the signal "DOWN" is detected. Reference is now made more particularly to FIG. 3 in order to illustrate one mode of implementation of the method for managing the operation of the loop PLL illustrated in the previous figures.

This FIG. 3 has the form of a timing diagram.

The first line of FIG. 3 shows the initial reference signal CKin which, as is seen, has a duty cycle other than 50%.

The second line shows the reference signal CKin/2, resulting from the division by two of the initial reference signal, and which this time has a duty cycle that is equal to 50%.

This signal CKin/2, as has been explained above, is the reference signal delivered on the second input E2 of the phase comparator PFD.

Moreover, it is seen that a reset pulse IMPRST that resets the first divider DV1, that is to say that resets the counter forming this first divider to 0, is emitted by the reset circuit MRST at each rising signal edge of the reference signal CKin/2.

Moreover, on each falling signal edge of the reference signal CKin/2, the phase comparator PFD compares the phase of the reference signal CKin/2 with the phase of the feedback signal CKFB/2, and consequently delivers the control pulse IMP of the signal UP.

This pulse IMP, when it is present, makes it possible to apply the pre-charging current Ip to the intermediate node ND2 of the filter FLT.

As this startup phase proceeds, it is noted that the duration of the pulse IMP of the signal UP decreases, since the output frequency of the signal $CK_{VCO}$ increases.

In addition, as indicated above, when the duration T of the pulse IMP is less than or equal to 2% of the product of the division ratio N and the period $TCK_{VCO}$ of the oscillator signal, the control signal ENST changes to 1, marking the end of the startup phase.

At this time, the first multiplexer Mux1 delivers the initial reference signal CKin, which becomes the reference signal, on the second input E2 of the phase comparator.

Moreover, the feedback signal delivered on the first input E1 of the phase comparator PFD becomes the signal CKfb coming directly from the divider (that is to say without having been divided by two beforehand).

At the same time, the switches SW1 are closed, connecting the two outputs (respectively delivering the two signals UP and DOWN) of the phase comparator PFD to the inputs of the charge pump circuit, so as to resume the conventional operation of a phase-locked loop.

The switch SW2 is opened, interrupting the application of the pre-charging current Ip.

The current for regulating the control voltage Vcontrol of the local oscillator VCO is this time the current Icp delivered by the charge pump circuit.

That being said, in order to speed up the synchronization of the signal $CK_{VCO}$ and of the reference signal CKin, the reset circuit MRST, as indicated above, performs a last reset of the first divider DV1 upon the first rising signal edge of the reference signal CKin that follows the end of the startup phase.

The phase-locked loop will then be ready to deliver its output signal after a few cycles.

This output signal may serve, for example, as a clock signal for a microprocessor.

The invention claimed is:

1. A method for operating a phase-locked loop (PLL) circuit, comprising:
    delivering a reference signal for a phase comparator of the PLL circuit;
    resetting a first divider of an output signal of a voltage-controlled oscillator of the PLL circuit at each first type signal edge of the reference signal;
    outputting by the phase comparator, in response to the reference signal and a feedback signal derived from an output of said first divider, a control pulse at each second type signal edge of the reference signal; and
    during startup, increasing a control voltage of the voltage-controlled oscillator in response to each control pulse by applying, in response to the control pulse, a pre-charging current to a resistive capacitive filter connected at an input of the voltage-controlled oscillator;
    after startup is complete, ceasing to apply the pre-charging current to the resistive capacitive filter in response to each control pulse.

2. The method according to claim 1, wherein delivering said reference signal comprises dividing an initial reference signal by two, and wherein said feedback signal is the output of the first divider divided by two.

3. A method for operating a phase-locked loop (PLL) circuit, comprising:
  delivering a reference signal for a phase comparator of the PLL circuit;
  resetting a first divider of an output signal of a voltage-controlled oscillator of the PLL circuit at each first type signal edge of the reference signal;
  outputting by the phase comparator, in response to the reference signal and a feedback signal derived from an output of said first divider, a control pulse at each second type signal edge of the reference signal; and
  increasing a control voltage of the voltage-controlled oscillator in response to each control pulse;
  wherein increasing the control voltage of the voltage-controlled oscillator comprises applying, in response to the control pulse, a pre-charging current to a resistive capacitive filter connected at an input of the voltage-controlled oscillator;
  wherein the resistive capacitive filter comprises:
    a first branch connected between said input of the voltage-controlled oscillator and ground and containing a resistive network connected in series with a first capacitor having a first capacitance, said resistive network containing a first resistor connected between said input of the voltage-controlled oscillator and an intermediate node and having a first resistance, and a second resistor connected between the intermediate node and the first capacitor and having a second resistance; and
    a second branch connected between said input of the voltage-controlled oscillator and ground and containing a second capacitor having a second capacitance;
    the first capacitance being equal to a value that is A times the second capacitance, and the first resistance being equal to a value that is A times the second resistance; and
  wherein said pre-charging current is applied to said intermediate node.

4. The method according to claim 1, further comprising terminating startup when a duration of the control pulse is less than a few percent of a product of a period of the output signal of the voltage-controlled oscillator and a division ratio of the first divider.

5. The method according to claim 4, further comprising, in response to terminating startup, connecting the output of the phase comparator to a charge pump circuit configured to generate the control voltage of the voltage-controlled oscillator.

6. The method according to claim 5, further comprising performing a last reset of the first divider on the first type signal edge of the reference signal following terminating startup.

7. The method according to claim 4, wherein delivering said reference signal comprises dividing an initial reference signal by two, and wherein said feedback signal is the output of the first divider divided by two, and further comprising, in response to terminating startup, delivering the initial reference signal to the phase comparator, and delivering the output signal of the first divider as the feedback signal to the phase comparator.

8. The method according to claim 7, further comprising performing a last reset of the first divider on the first type signal edge of the reference signal following terminating startup.

9. A phase-locked loop (PLL) circuit, comprising:
  a phase comparator;
  a voltage-controlled oscillator;
  a first divider connected between an output of the voltage-controlled oscillator and a first input of the phase comparator;
  a delivery circuit configured to deliver, in a startup phase of the PLL circuit, a reference signal to a second input of the phase comparator;
  a reset circuit configured, in said startup phase, to reset the first divider at each first type signal edge of the reference signal;
  wherein the phase comparator is configured, in said startup phase, to deliver a control pulse at each second type signal edge of the reference signal; and
  a control circuit configured to:
    during the startup phase, increase a control voltage of the voltage-controlled oscillator during said control pulse by applying, in response to the control pulse, a pre-charging current to a resistive capacitive filter connected at an input of the voltage-controlled oscillator, but
    after the startup phase is complete, ceasing to apply the pre-charging current to the resistive capacitive filter in response to each pulse.

10. A phase-locked loop (PLL) circuit, comprising:
  a phase comparator;
  a voltage-controlled oscillator;
  a first divider connected between an output of the voltage-controlled oscillator and a first input of the phase comparator;
  a delivery circuit configured to deliver, in a startup phase of the PLL circuit, a reference signal to a second input of the phase comparator;
  a reset circuit configured, in said startup phase, to reset the first divider at each first type signal edge of the reference signal;
  wherein the phase comparator is configured, in said startup phase, to deliver a control pulse at each second type signal edge of the reference signal; and
  a control circuit configured to increase a control voltage of the voltage-controlled oscillator during said control pulse;
  wherein the delivery circuit comprises:
    an input configured to receiving an initial reference signal;
    a divide-by-two divider connected to said input; and
    an output configured to deliver the initial reference signal divided by two as reference signal during said startup phase, and
    another divide-by-two divider active during said startup phase and connected between the output of the first divider and the first input of the phase comparator.

11. A phase-locked loop (PLL) circuit, comprising:
  a phase comparator;
  a voltage-controlled oscillator;
  a first divider connected between an output of the voltage-controlled oscillator and a first input of the phase comparator;
  a delivery circuit configured to deliver, in a startup phase of the PLL circuit, a reference signal to a second input of the phase comparator;

a reset circuit configured, in said startup phase, to reset the first divider at each first type signal edge of the reference signal;

wherein the phase comparator is configured, in said startup phase, to deliver a control pulse at each second type signal edge of the reference signal; and a control circuit configured to increase a control voltage of the voltage-controlled oscillator during said control pulse;

wherein the control circuit comprises:
 a current source configured to generate a pre-charging current that is selectively applied, in response to said control pulse, to a resistive capacitive filter connected at the input of the voltage-controlled oscillator;

wherein the resistive capacitive filter comprises:
 a first branch connected between said input of the voltage-controlled oscillator and ground and containing a resistive network connected in series with a first capacitor having a first capacitance, said resistive network containing a first resistor connected between said input of the oscillator and an intermediate node and having a first resistance, and a second resistor connected between the intermediate node and the first capacitor and having a second resistance; and
 a second branch connected between said input of the voltage-controlled oscillator and ground and containing a second capacitor having a second capacitance;

wherein the first capacitance is equal to a value A times the second capacitance, and wherein the first resistance is equal to a value A times the second resistance; and wherein the current source is connected to said intermediate node.

12. A phase-locked loop (PLL) circuit, comprising:
a phase comparator;
a voltage-controlled oscillator;
a first divider connected between an output of the voltage-controlled oscillator and a first input of the phase comparator;
a delivery circuit configured to deliver, in a startup phase of the PLL circuit, a reference signal to a second input of the phase comparator;
a reset circuit configured, in said startup phase, to reset the first divider at each first type signal edge of the reference signal;
wherein the phase comparator is configured, in said startup phase, to deliver a control pulse at each second type signal edge of the reference signal;
a control circuit configured to increase a control voltage of the voltage-controlled oscillator during said control pulse; and
a detection circuit configured to detect an end of the startup phase.

13. The circuit according to claim 12, wherein the detection circuit senses one of a duration of the control pulse and a type of pulse signal delivered by the phase comparator in order to detect end of the startup phase.

14. The circuit according to claim 13, wherein the detection circuit is further configured generate a signal indicating the end of the startup phase when the duration of the control pulse is less than a few percent of a product of a period of the output signal of the voltage-controlled oscillator and a division ratio of the first divider.

15. The circuit according to claim 12, further comprising a switching circuit configured, when the startup phase has ended, to connect the output of the phase comparator to a charge pump circuit which generates the control voltage of the voltage-controlled oscillator.

16. The circuit according to claim 15, wherein the reset circuit is configured, when the startup phase has ended, to perform a last reset of the first divider on the first type signal edge of the reference signal following the end of the startup phase.

17. The circuit according to claim 12, wherein the delivery circuit comprises:
 an input configured to receiving an initial reference signal;
 a divide-by-two divider connected to said input; and
 an output configured to deliver the initial reference signal divided by two as reference signal during said startup phase, and
further comprising another divide-by-two divider active during said startup phase and connected between the output of the first divider and the first input of the phase comparator;
wherein the delivery circuit is configured, when the startup phase has ended, to deliver the initial reference signal to the phase comparator;
a control circuit configured to deactivate said other divide-by-two divider, such that a feedback signal delivered to the phase comparator is the output signal of the first divider.

18. The circuit according to claim 17, wherein the reset circuit is configured, when the startup phase has ended, to perform a last reset of the first divider on the first type signal edge of the reference signal following the end of the startup phase.

19. The method according to claim 3, further comprising terminating startup when a duration of the control pulse is less than a few percent of a product of a period of the output signal of the voltage-controlled oscillator and a division ratio of the first divider.

20. The method according to claim 19, further comprising, in response to terminating startup, connecting the output of the phase comparator to a charge pump circuit configured to generate the control voltage of the voltage-controlled oscillator.

21. The method according to claim 20, further comprising performing a last reset of the first divider on the first type signal edge of the reference signal following terminating startup.

22. The method according to claim 19, wherein delivering said reference signal comprises dividing an initial reference signal by two, and wherein said feedback signal is the output of the first divider divided by two, and further comprising, in response to terminating startup, delivering the initial reference signal to the phase comparator, and delivering the output signal of the first divider as the feedback signal to the phase comparator.

23. The method according to claim 22, further comprising performing a last reset of the first divider on the first type signal edge of the reference signal following terminating startup.

24. The circuit according to claim 11, further comprising a detection circuit configured to detect an end of the startup phase.

25. The circuit according to claim 24, wherein the detection circuit senses one of a duration of the control pulse and a type of pulse signal delivered by the phase comparator in order to detect end of the startup phase.

26. The circuit according to claim 25, wherein the detection circuit is further configured generate a signal indicating the end of the startup phase when the duration of the control pulse is less than a few percent of a product of a period of the output signal of the voltage-controlled oscillator and a division ratio of the first divider.

27. The circuit according to claim 24, further comprising a switching circuit configured, when the startup phase has ended, to connect the output of the phase comparator to a charge pump circuit which generates the control voltage of the voltage-controlled oscillator.

28. The circuit according to claim 27, wherein the reset circuit is configured, when the startup phase has ended, to perform a last reset of the first divider on the first type signal edge of the reference signal following the end of the startup phase.

29. The circuit according to claim 24, wherein the delivery circuit comprises:
an input configured to receiving an initial reference signal;
a divide-by-two divider connected to said input; and
an output configured to deliver the initial reference signal divided by two as reference signal during said startup phase, and
further comprising another divide-by-two divider active during said startup phase and connected between the output of the first divider and the first input of the phase comparator;
wherein the delivery circuit is configured, when the startup phase has ended, to deliver the initial reference signal to the phase comparator;
a control circuit configured to deactivate said other divide-by-two divider, such that a feedback signal delivered to the phase comparator is the output signal of the first divider.

30. The circuit according to claim 29, wherein the reset circuit is configured, when the startup phase has ended, to perform a last reset of the first divider on the first type signal edge of the reference signal following the end of the startup phase.

31. The circuit according to claim 9, wherein the delivery circuit comprises:
an input configured to receiving an initial reference signal;
a divide-by-two divider connected to said input; and
an output configured to deliver the initial reference signal divided by two as reference signal during said startup phase, and
further comprising another divide-by-two divider active during said startup phase and connected between the output of the first divider and the first input of the phase comparator.

32. The circuit according to claim 9, wherein the resistive capacitive filter comprises:
a first branch connected between said input of the voltage-controlled oscillator and ground and containing a resistive network connected in series with a first capacitor having a first capacitance, said resistive network containing a first resistor connected between said input of the oscillator and an intermediate node and having a first resistance, and a second resistor connected between the intermediate node and the first capacitor and having a second resistance; and
a second branch connected between said input of the voltage-controlled oscillator and ground and containing a second capacitor having a second capacitance;
wherein the first capacitance is equal to a value A times the second capacitance, and wherein the first resistance is equal to a value A times the second resistance; and
wherein a current source is connected to said intermediate node to deliver the pre-charge current.

33. The circuit according to claim 9, further comprising a detection circuit configured to detect an end of the startup phase.

34. The circuit according to claim 33, wherein the detection circuit senses one of a duration of the control pulse and a type of pulse signal delivered by the phase comparator in order to detect end of the startup phase.

35. The circuit according to claim 34, wherein the detection circuit is further configured generate a signal indicating the end of the startup phase when the duration of the control pulse is less than a few percent of a product of a period of the output signal of the voltage-controlled oscillator and a division ratio of the first divider.

36. The circuit according to claim 33, further comprising a switching circuit configured, when the startup phase has ended, to connect the output of the phase comparator to a charge pump circuit which generates the control voltage of the voltage-controlled oscillator.

37. The circuit according to claim 36, wherein the reset circuit is configured, when the startup phase has ended, to perform a last reset of the first divider on the first type signal edge of the reference signal following the end of the startup phase.

38. The circuit according to claim 33, wherein the delivery circuit comprises:
an input configured to receiving an initial reference signal;
a divide-by-two divider connected to said input; and
an output configured to deliver the initial reference signal divided by two as reference signal during said startup phase, and
further comprising another divide-by-two divider active during said startup phase and connected between the output of the first divider and the first input of the phase comparator;
wherein the delivery circuit is configured, when the startup phase has ended, to deliver the initial reference signal to the phase comparator;
a control circuit configured to deactivate said other divide-by-two divider, such that a feedback signal delivered to the phase comparator is the output signal of the first divider.

39. The circuit according to claim 38, wherein the reset circuit is configured, when the startup phase has ended, to perform a last reset of the first divider on the first type signal edge of the reference signal following the end of the startup phase.

40. The circuit according to claim 10, wherein the control circuit comprises:
a current source configured to generate a pre-charging current that is selectively applied, in response to said control pulse, to a resistive capacitive filter connected at the input of the voltage-controlled oscillator.

41. The circuit according to claim 40, wherein the resistive capacitive filter comprises:
a first branch connected between said input of the voltage-controlled oscillator and ground and containing a resistive network connected in series with a first capacitor having a first capacitance, said resistive network containing a first resistor connected between said input of the oscillator and an intermediate node and having a first resistance, and a second resistor connected between the intermediate node and the first capacitor and having a second resistance; and a second branch connected between said input of the voltage-controlled oscillator and ground and containing a second capacitor having a second capacitance;

wherein the first capacitance is equal to a value A times the second capacitance, and wherein the first resistance is equal to a value A times the second resistance; and wherein the current source is connected to said intermediate node.

42. The circuit according to claim 10, further comprising a detection circuit configured to detect an end of the startup phase.

43. The circuit according to claim 42, wherein the detection circuit senses one of a duration of the control pulse and a type of pulse signal delivered by the phase comparator in order to detect end of the startup phase.

44. The circuit according to claim 43, wherein the detection circuit is further configured generate a signal indicating the end of the startup phase when the duration of the control pulse is less than a few percent of a product of a period of the output signal of the voltage-controlled oscillator and a division ratio of the first divider.

45. The circuit according to claim 42, further comprising a switching circuit configured, when the startup phase has ended, to connect the output of the phase comparator to a charge pump circuit which generates the control voltage of the voltage-controlled oscillator.

46. The circuit according to claim 45, wherein the reset circuit is configured, when the startup phase has ended, to perform a last reset of the first divider on the first type signal edge of the reference signal following the end of the startup phase.

47. The circuit according to claim 42, wherein the delivery circuit comprises:

an input configured to receiving an initial reference signal;

a divide-by-two divider connected to said input; and an output configured to deliver the initial reference signal divided by two as reference signal during said startup phase, and further comprising another divide-by-two divider active during said startup phase and connected between the output of the first divider and the first input of the phase comparator;

wherein the delivery circuit is configured, when the startup phase has ended, to deliver the initial reference signal to the phase comparator;

a control circuit configured to deactivate said other divide-by-two divider, such that a feedback signal delivered to the phase comparator is the output signal of the first divider.

48. The circuit according to claim 47, wherein the reset circuit is configured, when the startup phase has ended, to perform a last reset of the first divider on the first type signal edge of the reference signal following the end of the startup phase.

* * * * *